(12) United States Patent
Hu

(10) Patent No.: US 10,381,288 B2
(45) Date of Patent: *Aug. 13, 2019

(54) PACKAGED SEMICONDUCTOR DIE AND CTE-ENGINEERING DIE PAIR

(71) Applicant: Intel Corporation, Santa Clara, CA (US)

(72) Inventor: Chuan Hu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/133,164

(22) Filed: Sep. 17, 2018

(65) Prior Publication Data

US 2019/0035711 A1 Jan. 31, 2019

Related U.S. Application Data

(63) Continuation of application No. 13/995,479, filed as application No. PCT/US2011/066546 on Dec. 21, 2011, now Pat. No. 10,096,535.

(51) Int. Cl.
*H01L 23/373* (2006.01)
*H01L 21/48* (2006.01)
(Continued)

(52) U.S. Cl.
CPC ...... *H01L 23/3736* (2013.01); *H01L 21/4871* (2013.01); *H01L 23/3128* (2013.01); *H01L 23/5389* (2013.01); *H01L 24/19* (2013.01); *H01L 24/97* (2013.01); *H01L 25/0657* (2013.01); *H01L 2224/12105* (2013.01);
(Continued)

(58) Field of Classification Search
CPC ............. H01L 23/3736; H01L 21/4871; H01L 23/3128; H01L 23/5389; H01L 24/19; H01L 24/97; H01L 25/0657; H01L 2224/12105; H01L 2224/73267; H01L 2224/97; H01L 2924/01322;
(Continued)

(56) References Cited

U.S. PATENT DOCUMENTS 8,344,505 B2 1/2013 Neil McIellan et al.
8,421,245 B2 4/2013 Gonzalez et al.
(Continued)

FOREIGN PATENT DOCUMENTS

TW 200629497 8/2006

OTHER PUBLICATIONS

Letter of Patent for Chinese Patent Application No. 201180076404.3 dated Nov. 11, 2017, 3 pgs.
(Continued)

*Primary Examiner* — Fernando L Toledo
*Assistant Examiner* — Neil R Prasad
(74) *Attorney, Agent, or Firm* — Schwabe, Williamson & Wyatt, P.C.

(57) ABSTRACT

Packaged semiconductor die and CTE-engineering die pairs and methods to form packaged semiconductor die and CTE-engineering die pairs are described. For example, a semiconductor package includes a substrate. A semiconductor die is embedded in the substrate and has a surface area. A CTE-engineering die is embedded in the substrate and coupled to the semiconductor die. The CTE-engineering die has a surface area the same and in alignment with the surface area of the semiconductor die.

20 Claims, 5 Drawing Sheets

(51) Int. Cl.
  H01L 23/31 (2006.01)
  H01L 23/538 (2006.01)
  H01L 23/00 (2006.01)
  H01L 25/065 (2006.01)

(52) U.S. Cl.
  CPC .................. *H01L 2224/73267* (2013.01); *H01L 2224/97* (2013.01); *H01L 2924/01322* (2013.01); *H01L 2924/01327* (2013.01); *H01L 2924/10253* (2013.01); *H01L 2924/12042* (2013.01); *H01L 2924/18162* (2013.01)

(58) Field of Classification Search
  CPC . H01L 2924/01327; H01L 2924/10253; H01L 2924/12042; H01L 2924/18162
  See application file for complete search history.

(56) References Cited

U.S. PATENT DOCUMENTS

| | | |
|---|---|---|
| 2003/0146519 A1 | 8/2003 | Huang |
| 2005/0121765 A1 | 6/2005 | Lin |
| 2005/0211749 A1 | 9/2005 | Hu et al. |
| 2006/0249823 A1 | 11/2006 | Kim |
| 2006/0261469 A1 | 11/2006 | Ni et al. |
| 2007/0037319 A1 | 2/2007 | Chan et al. |
| 2007/0178622 A1 | 8/2007 | Liu et al. |
| 2008/0083981 A1 | 4/2008 | Romig et al. |
| 2008/0211081 A1 | 9/2008 | Lee |
| 2008/0211083 A1 | 9/2008 | Kang et al. |
| 2008/0303163 A1 | 12/2008 | Liu et al. |
| 2009/0113705 A1 | 5/2009 | McKinley |
| 2009/0321932 A1 | 12/2009 | Gonzalez et al. |
| 2010/0221854 A1 | 9/2010 | Koller et al. |
| 2010/0309704 A1 | 12/2010 | Dattaguru et al. |
| 2011/0018123 A1 | 1/2011 | An et al. |
| 2011/0272824 A1 | 11/2011 | Pagaila |
| 2012/0161331 A1 | 6/2012 | Gonzalez et al. |
| 2013/0003319 A1 | 1/2013 | Malatkar et al. |

OTHER PUBLICATIONS

Guzek, John Stephen et al., U.S. Appl. No. 12/655,335 entitled "Semiconductor Package With Embedded Die and Its Methods of Fabrication," filed Dec. 29, 2009, 36 pgs.
Guzek, John Stephen et al., U.S. Appl. No. 12/890,082 entitled "Die Stacking Using Through-Silicon Vias on Bumpless Build-Up Layer Substrates Including Embedded-Dice, and Processes of Forming Same," filed Sep. 24, 2010, 53 pgs.
International Search Report and Written Opinion from PCT/US2011/061628 dated Jul. 16, 2012, 9 pgs.
First Office Action for Chinese Patent Application No. 201180076404.3, dated May 30, 2016, 11 pgs.
Second Office Action for Chinese Patent Application No. 201180076404.3, dated Jan. 18, 2017, 9 pgs., no English translation.
International Search Report and Written Opinion from PCT/US2011/066546 dated Sep. 25, 2012, 10 pgs.
International Preliminary Report on Patentability from PCT/US2011/066546 dated Jul. 3, 2014, 7 pgs.

US 10,381,288 B2

PACKAGED SEMICONDUCTOR DIE AND CTE-ENGINEERING DIE PAIR

CLAIM OF PRIORITY

This application is a continuation of U.S. patent application Ser. No. 13/995,479 filed Jun. 28, 2013, which is a U.S. National Phase application under 35 U.S.C. § 371 of International Application No. PCT/US2011/066546, filed Dec. 21, 2011, entitled "PACKAGED SEMICONDUCTOR DIE AND CTE-ENGINEERING DIE PAIR," the entire contents of which are incorporated herein by reference.

TECHNICAL FIELD

Embodiments of the invention are in the field of semiconductor packages and, in particular, packaged semiconductor die and CTE-engineering die pairs.

BACKGROUND

Today's consumer electronics market frequently demands complex functions requiring very intricate circuitry. Scaling to smaller and smaller fundamental building blocks, e.g. transistors, has enabled the incorporation of even more intricate circuitry on a single die with each progressive generation. Semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. For example, some semiconductor packages now use a coreless substrate, which does not include the thick resin core layer commonly found in conventional substrates. Furthermore, the demand for higher performance devices results in a need for an improved semiconductor package that enables a thin packaging profile and low overall warpage compatible with subsequent assembly processing.

On the other hand, although scaling is typically viewed as a reduction in size, the size of a particular semiconductor die may in fact be increased in order to include multi-functional components on a single die. However, structural issue may arise when attempting to package larger scale semiconductor die in a semiconductor package. For example, the effect of differences in the coefficients of thermal expansion (CTE) between components used in a semiconductor package can lead to detrimental defects as a result of performing the semiconductor die packaging process.

SUMMARY

Embodiments of the present invention include packaged semiconductor die and CTE-engineering die pairs and methods to form packaged semiconductor die and CTE-engineering die pairs.

In an embodiment, a semiconductor package includes a substrate. A semiconductor die is embedded in the substrate and has a surface area. A CTE-engineering die is embedded in the substrate and coupled to the semiconductor die. The CTE-engineering die has a surface area the same and in alignment with the surface area of the semiconductor die.

In another embodiment, a semiconductor package includes a substrate having a land side. A semiconductor die is embedded in the substrate. The semiconductor die has an active side proximate to the land side of the substrate. The semiconductor die also has a back side with a surface area distal from the land side of the substrate. A CTE-engineering die is embedded in the substrate and coupled to the semiconductor die. The CTE-engineering die has a surface area the same and in alignment with the surface area of the back side of the semiconductor die. The CTE of the CTE-engineering die dominates a combined CTE of the semiconductor die and the CTE-engineering die.

In another embodiment, a method of fabricating a semiconductor package includes thinning a semiconductor wafer from a backside of the semiconductor wafer. Subsequently, the semiconductor wafer is coupled to a CTE-engineering wafer or panel via the backside of the semiconductor wafer. The semiconductor wafer and the CTE-engineering wafer or panel are then singulated to form a plurality of semiconductor die and CTE-engineering die pairs. A semiconductor die and CTE-engineering die pair is packaged in a single package.

DETAILED DESCRIPTION

Figure 1:
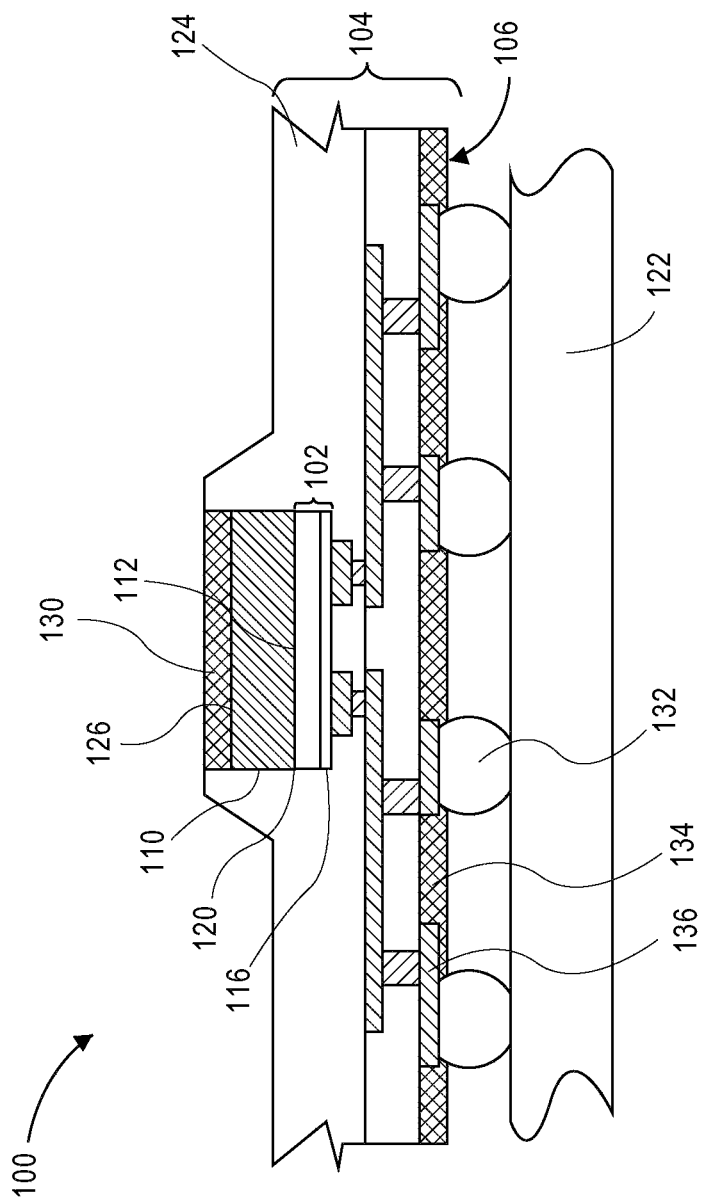
FIG. 1 illustrates a cross-sectional view of a packaged semiconductor die and CTE-engineering die pair, in accordance with an embodiment of the present invention.

Packaged semiconductor die and CTE-engineering die pairs and methods to form packaged semiconductor die and CTE-engineering die pairs are described. In the following description, numerous specific details are set forth, such as packaging architectures and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments of the present invention are directed to fabricating a coefficient of thermal expansion (CTE) engineered silicon wafer or die. The CTE-engineered silicon wafer or die may more closely match the CTE of organic components for embedded and/or fan out three-dimensional (3D) packaging. For example, with 3D processes may be used to increase the density, reduce cost and improve form factor for broader applications of semiconductor devices and products. One of the main issues with 3D integration, however, is the CTE mismatch with organic layers which may lead to lead to poor warpage (flatness) control, lower yield and limit the fine line/space interconnects.

One approach to remedying the above issues has been to integrate a silicon die with a glass interposer to bring additional materials into the 3D stack with matched or nearly CTE to the silicon die. However, such an approach only addresses the interconnect between silicon and glass and may bring other issues with the glass/silicon to organic components interface with unknown reliability impact.

Instead, in accordance with one or more embodiments of the present invention, CTE mismatch of either embedded silicon or silicon used for fan out with a silicon device is addressed by engineering the silicon to have CTE that matches or nearly matches with the organic components of, e.g., a semiconductor package. For example in one embodiment, a very thin silicon die is bonded on a thick copper die with hard solder such that the CTE of the combined device is dominated by the copper die. This device (semiconductor die and copper die pair) may be easier to handle, may have no mechanical risk, may be fully compatible with organic build up technology, may improve the yield in fan out, and may improve the heat handling significantly.

In an embodiment, packaging of a semiconductor die and copper die pair is used to improve the thermal performance of a bumpless build-up layer (BBUL)-like product and facilitate use of BBUL processing for larger dies. In an embodiment, packaging of a semiconductor die and copper die pair is used to facilitate embedding smaller silicon slices. In an embodiment, a silicon die or wafer or slice is coupled with a CTE-engineering die. The term CTE-engineering die may be used to indicate that this dies, rather than the silicon or semiconductor die, dominates the CTE of, e.g., a semiconductor die and CTE-engineering die pair. Thus, effectively, the CTE of the semiconductor die is altered with respect to its impact on a semiconductor package housing the semiconductor die. For example, in one such embodiment, a silicon die is paired with a copper CTE-engineering die. The copper die dominates the CTE of the pair. In a specific such embodiment, the semiconductor die and CTE-engineering die pair is coupled by using a eutectic gold (Au) and tin (Sn) solder.

A packaged semiconductor die and CTE-engineering die pair may be housed in a variety of packaging options. One such option is housing such a pair in a coreless substrate formed by a BBUL process. For example, FIG. 1 illustrates a cross-sectional view of a packaged semiconductor die and CTE-engineering die pair, in accordance with an embodiment of the present invention.

Referring to FIG. 1, a semiconductor package 100 includes a substrate 104 having a land side 106. A semiconductor die 102 is embedded in the substrate 104. The semiconductor die 102 has an active side 116 proximate to the land side 106 of the substrate 104. The semiconductor die 102 also has a back side 112 having a surface area distal from the land side 106 of the substrate 104. A CTE-engineering die 110 is embedded in the substrate 104 and coupled to the semiconductor die 102. The CTE-engineering die 110 has a surface area the same and in alignment with the surface area of the back side of the semiconductor die 102, e.g., at interface 120.

In accordance with an embodiment of the present invention, the CTE of the CTE-engineering die 110 dominates the combined CTE of the semiconductor die 102 and the CTE-engineering die 110. In one such embodiment, the semiconductor die 102 is composed of silicon, and the CTE-engineering die 110 is composed of copper. In another such embodiment, the CTE-engineering die 110 is, or is greater than, approximately 5 times as thick as the semiconductor die 102. For example, in a specific such embodiment, the semiconductor die 102 has a thickness of approximately 20 microns, and the CTE-engineering die 110 has a thickness of approximately 100 microns.

In an embodiment, the substrate 104 is a BBUL substrate, as depicted in FIG. 1. In one such embodiment, the substrate 104 is a coreless substrate, as is also depicted in FIG. 1. However, in another embodiment, a semiconductor die and a CTE-engineering die are housed in a core of a substrate, as described below in association with FIG. 3. In another embodiment, a substrate includes a fan-out layer, as described below in association with FIG. 2E.

BBUL is a processor packaging technology that is bumpless since it does not use the usual small solder bumps to attach the silicon die to the processor package wires. It has build-up layers since it is grown or built-up around the silicon die. Some semiconductor packages now use a coreless substrate, which does not include the thick resin core layer commonly found in conventional substrates. In an embodiment, as part of the BBUL process, electrically conductive vias and routing layers are formed above the active side 116 of the semiconductor die 102 using a semi-additive process (SAP) to complete remaining layers. In an embodiment, an external contact layer is formed. In one embodiment, an array of external conductive contacts is a ball grid array (BGA). In other embodiments, the array of external conductive contacts is an array such as, but not limited to, a land grid array (LGA) or an array of pins (PGA).

In an embodiment, substrate 104 is a coreless substrate since a panel is used to support packaging of semiconductor die 102 through to formation of an array of external conductive conducts. The panel is then removed to provide a coreless package for the semiconductor die. Accordingly, in an embodiment, the term "coreless" is used to mean that the support upon which the package was formed for housing a die is ultimately removed at the end of a build-up process. In a specific embodiment, a coreless substrate is one that does not include a thick core after completion of the fabrication process. As an example, a thick core may be one composed of a reinforced material such as is used in a motherboard and may include conductive vias therein. It is to be understood that die-bonding film may be retained or may be removed. In either case, inclusion or exclusion of a die-bonding film following removal of the panel provides a coreless substrate. Still further, the substrate may be considered a coreless substrate because it does not include a thick core such as a fiber reinforced glass epoxy resin.

In an embodiment, the active surface 116 of semiconductor die 102 includes a plurality of semiconductor devices, such as but not limited to transistors, capacitors and resistors interconnected together by a die interconnection structure into functional circuits to thereby form an integrated circuit. As will be understood to those skilled in the art, the device side of the semiconductor die includes an active portion with integrated circuitry and interconnections. The semiconductor die may be any appropriate integrated circuit device including but not limited to a microprocessor (single or multi-core), a memory device, a chipset, a graphics device, an application specific integrated circuit according to several different embodiments.

The packaged semiconductor die 102 may, in an embodiment, be a fully embedded and surrounded semiconductor die. As used in this disclosure, "fully embedded and surrounded" means that all surfaces of the semiconductor die are in contact with an encapsulating film (such as a dielectric layer) of substrate, or at least in contact with a material housed within the encapsulating film. Said another way, "fully embedded and surrounded" means that all exposed surfaces of the semiconductor die are in contact with the encapsulating film of a substrate.

The packaged semiconductor die 102 may, in an embodiment, be a fully embedded semiconductor die. As used in this disclosure, "fully embedded" means that an active surface and the entire sidewalls of the semiconductor die are in contact with an encapsulating film (such as a dielectric layer) of a substrate, or at least in contact with a material housed within the encapsulating film. Said another way, "fully embedded" means that all exposed regions of an active surface and the exposed portions of the entire sidewalls of the semiconductor die are in contact with the encapsulating film of a substrate. However, in such cases, the semiconductor die is not "surrounded" since the backside of the semiconductor die is not in contact with an encapsulating film of the substrate or with a material housed within the encapsulating film. In a first embodiment, a back surface of the semiconductor die protrudes from the global planarity surface of the die side of a substrate. In a second embodiment, no surface of the semiconductor die protrudes from the global planarity surface of the die side of a substrate.

In contrast to the above definitions of "fully embedded and surrounded" and "fully embedded," a "partially embedded" die is a die having an entire surface, but only a portion of the sidewalls, in contact with an encapsulating film of a substrate (such as a coreless substrate), or at least in contact with a material housed within the encapsulating film. In further contrast, a "non-embedded" die is a die having at most one surface, and no portion of the sidewalls, in contact with an encapsulating film of a substrate (such as a coreless substrate), or in contact with a material housed within the encapsulating film.

Referring again to FIG. 1, in an embodiment, a die-bonding film 130 is disposed on the backside 126 the CTE-engineering die 110. In an embodiment, the substrate 104 includes an encapsulant layer 126. In an embodiment, as depicted in FIG. 1, package 100 includes a foundation substrate 122 at the land side 106 of the substrate 104. For example, where the semiconductor die 102 is part of a hand-held device such as a smart phone embodiment or a hand-held reader embodiment, the foundation substrate 122 is a motherboard. In another exemplary embodiment, where the semiconductor die 102 is part of a hand-held device such as a smart phone embodiment or a hand-held reader embodiment, the foundation substrate 122 is an external shell such as the portion an individual touches during use. In another exemplary embodiment, where the semiconductor die 102 is part of a hand-held device such as a smart phone embodiment or a hand-held reader embodiment, the foundation substrate 122 includes both the motherboard and an external shell such as the portion an individual touches during use.

An array of external conductive contacts 132 is disposed on the land side 106 of the substrate 104. In an embodiment, the external conductive contacts 132 couple the substrate 104 to the foundation substrate 122. The external conductive contacts 132 may be used for electrical communication with the foundation substrate 122. In one embodiment, the array of external conductive contacts 132 is a ball grid array (BGA). A solder mask 134 makes up the material that forms the land side 106 of the substrate 104. The external conductive contacts 132 are disposed upon bump bond pads 136.

In another aspect, FIGS. 2A-2E illustrate cross-sectional views representing various operations in a method of fabricating a packaged semiconductor die and CTE-engineering die pair, in accordance with an embodiment of the present invention.

Figure 2A:
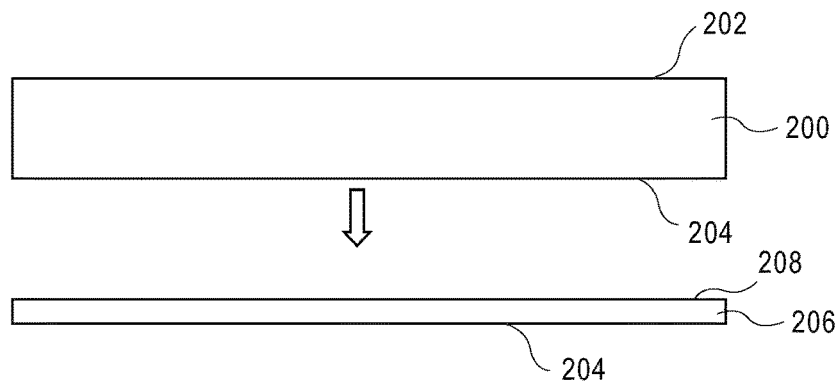
FIG. 2A illustrates cross-sectional views representing a thinning operation for thinning a semiconductor wafer from a backside of the semiconductor wafer in a method of fabricating a packaged semiconductor die and CTE-engineering die pair, in accordance with an embodiment of the present invention.

Referring to FIG. 2A, a semiconductor wafer 200 has a backside 202 and an active side 204. The semiconductor wafer 200 is thinned from the backside 202 to provide thinned semiconductor wafer 206, having active side 204 still in tact and a newly exposed backside 208. In an embodiment, the semiconductor wafer 200 is thinned from a staring thickness of approximately 750 microns to a thickness less than approximately 100 microns. In a specific embodiment, the semiconductor wafer 200 is thinned from a staring thickness of approximately 750 microns to a thickness of approximately 20 microns. In an embodiment, the semiconductor wafer 200 is thinned by a back side grind process such as, but not limited to, a chemical mechanical polishing process.

Figure 2B:
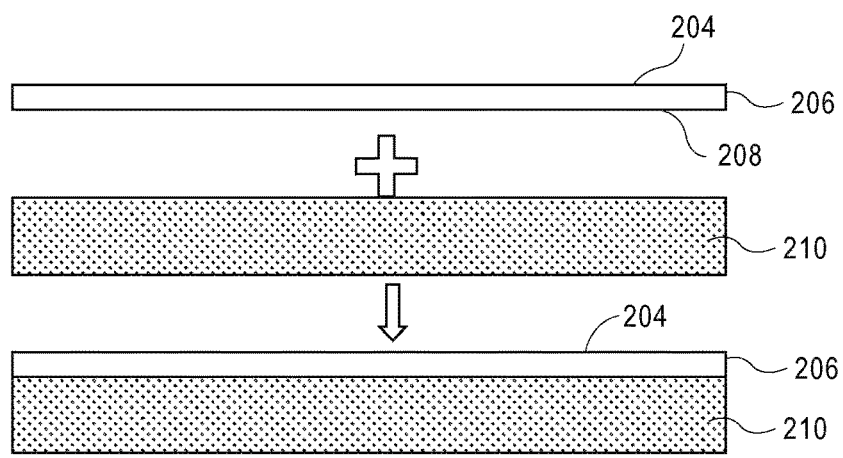
FIG. 2B illustrates cross-sectional views representing a coupling operation for coupling the semiconductor wafer of FIG. 2A to a CTE-engineering wafer or panel via the backside of the semiconductor wafer, in accordance with an embodiment of the present invention.

Referring to FIG. 2B, the thinned semiconductor wafer 206 is coupled to a wafer or panel 210. In accordance with an embodiment of the present invention, the wafer or panel 210 has a CTE different from the CTE of the thinned semiconductor wafer 206 and may be referred to as a CTE-engineering wafer or panel. In an embodiment, the coupling involves coupling a thinned silicon die to a rigid copper wafer or panel, also known as a slice. In one such embodiment, the coupling is performed by soldering with a hard solder having a melting point above approximately 300 degrees Celsius. In a specific such embodiment, the solder is a eutectic solder of gold (Au) and tin (Sn) used to coupled silicon and copper. In an alternative embodiment, an intermetallic compound and/or an organic material adhesive is used to couple the thinned semiconductor wafer 206 coupled to the wafer or panel 210. In an embodiment, the thickness of the CTE-engineering wafer or panel 210 is selected to dominate the CTE of the semiconductor wafer 206 and CTE-engineering wafer or panel 210 pair. For example, in a specific embodiment, the CTE-engineering wafer or panel 210 is, or is greater than, approximately 5 times as thick as the thinned semiconductor wafer 206.

Figure 2C:
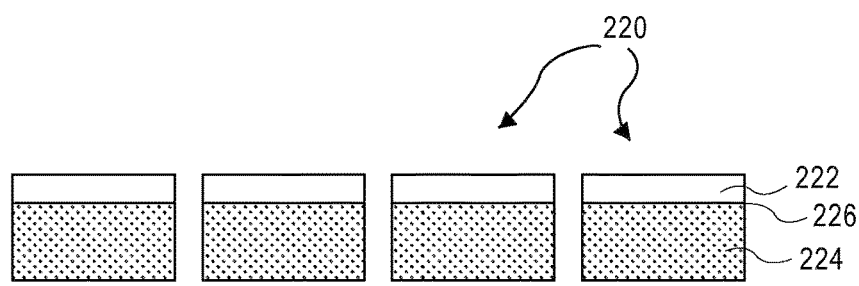
FIG. 2C illustrates a cross-sectional view representing a singulating operation for singulating the semiconductor wafer and the CTE-engineering wafer or panel of FIG. 2B to form a plurality of semiconductor die and CTE-engineering die pairs, in accordance with an embodiment of the present invention.

Referring to FIG. 2C, the semiconductor wafer 206 and the CTE-engineering wafer or panel 210 pair is singulated to provided individual units 220, e.g., individual units each having an independent integrated circuit (IC). The individual units 220 may be viewed as including a semiconductor die 222 and a CTE-engineering die 224. Accordingly, since the semiconductor die 222 and a CTE-engineering die 224 are formed in the same singulation operation, they are the same size and are aligned with one another. That is, at their interface 226, the semiconductor die 222 and the CTE-engineering die 224 have the same surface areas that are aligned with one another. In an embodiment, singulation is performed by sawing, by laser ablation, or by a combination thereof. In an alternative embodiment, not shown, thinned semiconductor wafer 206 is singulated and then coupled with CTE-engineering die.

Figure 2D:
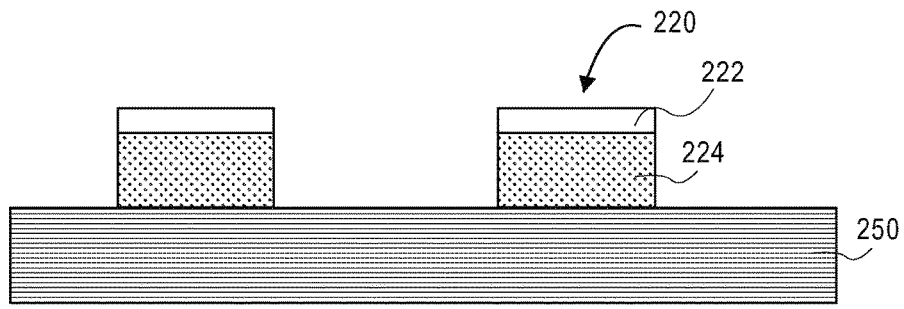
FIG. 2D illustrates a cross-sectional view representing a redistributing operation in a method of fabricating a packaged semiconductor die and CTE-engineering die pair, in accordance with an embodiment of the present invention.

Referring to FIG. 2D, the semiconductor die 222 and CTE-engineering die 224 pairs 220 are redistributed on a carrier 250. In an embodiment, the carrier is a panel, as described in greater detail below in association with FIG. 5.

Figure 2E:
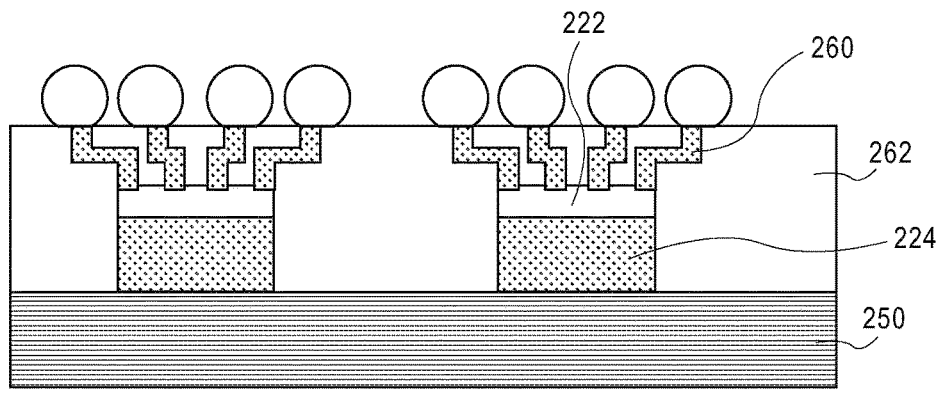
FIG. 2E illustrates a cross-sectional view representing a layer build-up operation in a method of fabricating a packaged semiconductor die and CTE-engineering die pair, in accordance with an embodiment of the present invention.

Referring to FIG. 2E, a build-up process is performed on the carrier 250 including fabrication of a fan-out layer 260 above the semiconductor die 222. In accordance with an embodiment of the present invention, the fan-out layer 260 is substantially flatter than conventional processes due in part to the CTE domination of the CTE-engineering die 224. In an embodiment, the semiconductor die 222 and the CTE-engineering die 224 are housed in a same molding layer 262, as depicted in FIG. 2E. In an embodiment, the structure of FIG. 2E may undergo debonding from carrier 250 and singulation to provide individually packaged devices, each having a semiconductor die 222 and CTE-engineering die 224 pair.

Figure 3:
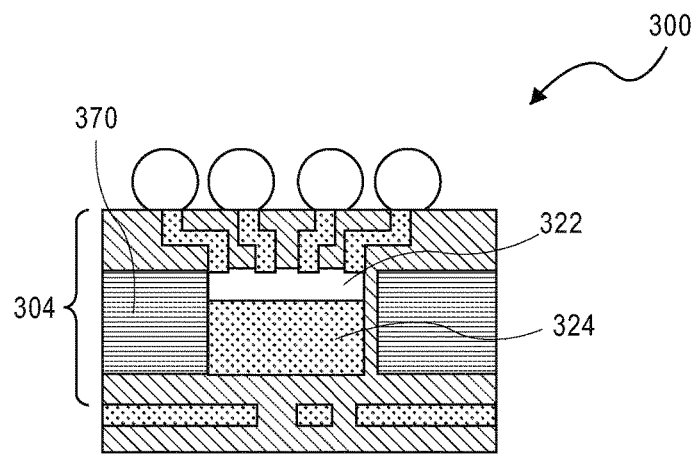
FIG. 3 illustrates a cross-sectional view of a packaged semiconductor die and CTE-engineering die pair, in accordance with an embodiment of the present invention.

In another aspect, a semiconductor die and a CTE-engineering die are housed in a core of a substrate. For example, FIG. 3 illustrates a cross-sectional view of a packaged semiconductor die and CTE-engineering die pair, in accordance with an embodiment of the present invention. Referring to FIG. 3, a semiconductor package 300 includes a semiconductor die 322 and CTE-engineering die 324 pair embedded in a substrate 304 with build-up layers fabricated thereon. In an embodiment, the semiconductor die 322 and CTE-engineering die 324 pair is embedded in a core 370 of the substrate 304. In one such embodiment, the semiconductor die 322 and CTE-engineering die 324 pair are embedded within the same core material, as depicted in FIG. 3.

Figure 4:
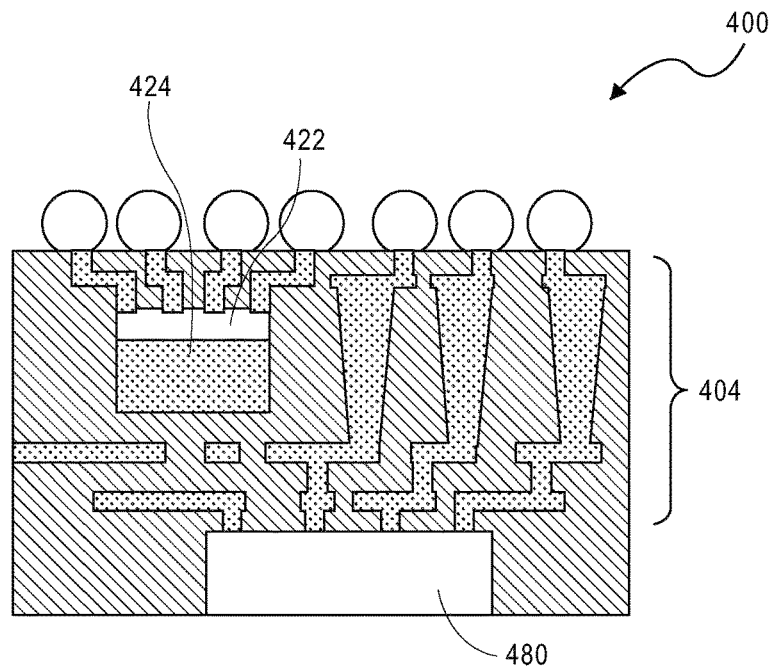
FIG. 4 illustrates a cross-sectional view of a packaged semiconductor die and CTE-engineering die pair, in accordance with an embodiment of the present invention.

In another aspect, a semiconductor die and a CTE-engineering die are housed in build-up layer of a BBUL package including a separate semiconductor die. For example, FIG. 4 illustrates a cross-sectional view of a packaged semiconductor die and CTE-engineering die pair, in accordance with an embodiment of the present invention. Referring to FIG. 4, a semiconductor package 400 includes a semiconductor die 422 and CTE-engineering die 424 pair. Another semiconductor die 480 is also included in the package 400. A BBUL process may be performed using the semiconductor die 480 as the foundation of the BBUL process. In an embodiment, during the BBUL process, the semiconductor die 422 and CTE-engineering die 424 pair is embedded in the substrate 404 as part of the build-up layers fabricated on semiconductor die 480.

As mentioned briefly above, a semiconductor die and CTE-engineering die pair may be packaged on a panel. For example, FIG. 5 illustrates a cross-sectional view representing an operations in a method of fabricating a packaged semiconductor die and CTE-engineering die pair, in accordance with an embodiment of the present invention.

Figure 5:
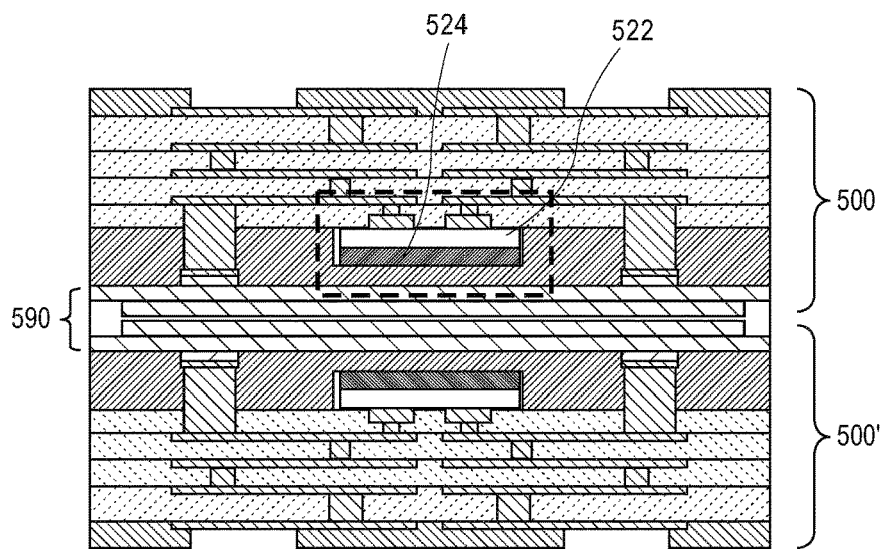
FIG. 5 illustrates a cross-sectional view representing an operation in a method of fabricating a packaged semiconductor die and CTE-engineering die pair, in accordance with an embodiment of the present invention.

Referring to FIG. 5, the above fabrication processes may, in an embodiment, be performed on a carrier 590. Carrier 590, such as a panel, may be provided having a plurality of cavities disposed therein, each sized to receive a semiconductor die 522 and CTE-engineering die 524 pair. During processing, identical structures (e.g., 500 and 500') may be mated in order to build a back-to-back apparatus for processing utility. Consequently, processing throughput is effectively doubled. The structure shown in FIG. 5 may form part of a larger panel with a plurality of identical regions having a similar or the same cross-section.

For example, a panel may include 1000 recesses on either side, allowing for fabrication of 2000 individual packages from a single panel. The panel may include an adhesion release layer and an adhesive binder. A cutting zone may be provided at each end of the apparatus 500 or 500' for separation processing. A backside of a semiconductor die 522 and CTE-engineering die 524 pair (e.g. at the backside of the CTE-engineer die portion) may be bonded to the panel with a die-bonding film. Encapsulating layers may be formed by a lamination process. In another embodiment, one or more encapsulation layers may be formed by spinning on and curing a dielectric upon a wafer-scale array of apparatuses of which the apparatus 500 is merely a subset for illustrative simplicity.

In an embodiment, one or more of the above described semiconductor packages housing a semiconductor die and CTE-engineering die are paired with other packages following the packaging process, e.g., the coupling of a packaged memory die with a package logic die. In an example, connections between two or more individually packaged die may be made post BBUL fabrication by using thermal compression bonding (TCB) processing. In another embodiment, more than one both die are embedded in the same package. For example, in one embodiment, a packaged semiconductor die and CTE-engineering die pair further includes a secondary stacked die. The first die may have one or more through-silicon vias disposed therein (TSV die). The second die may be electrically coupled to the TSV die through the one or more through-silicon vias. The apparatus may also include a coreless substrate. In one embodiment, both die are embedded in the coreless substrate.

Thus, embodiments of the present invention enable fabrication of packaged semiconductor die and CTE-engineering die pairs. Such embodiments may provide benefits such as, but not limited to, cost reduction and lower interlayer dielectric (ILD) stresses. The unique combination of components and techniques described herein may be fully compatible with conventional equipment toolsets.

Figure 6:
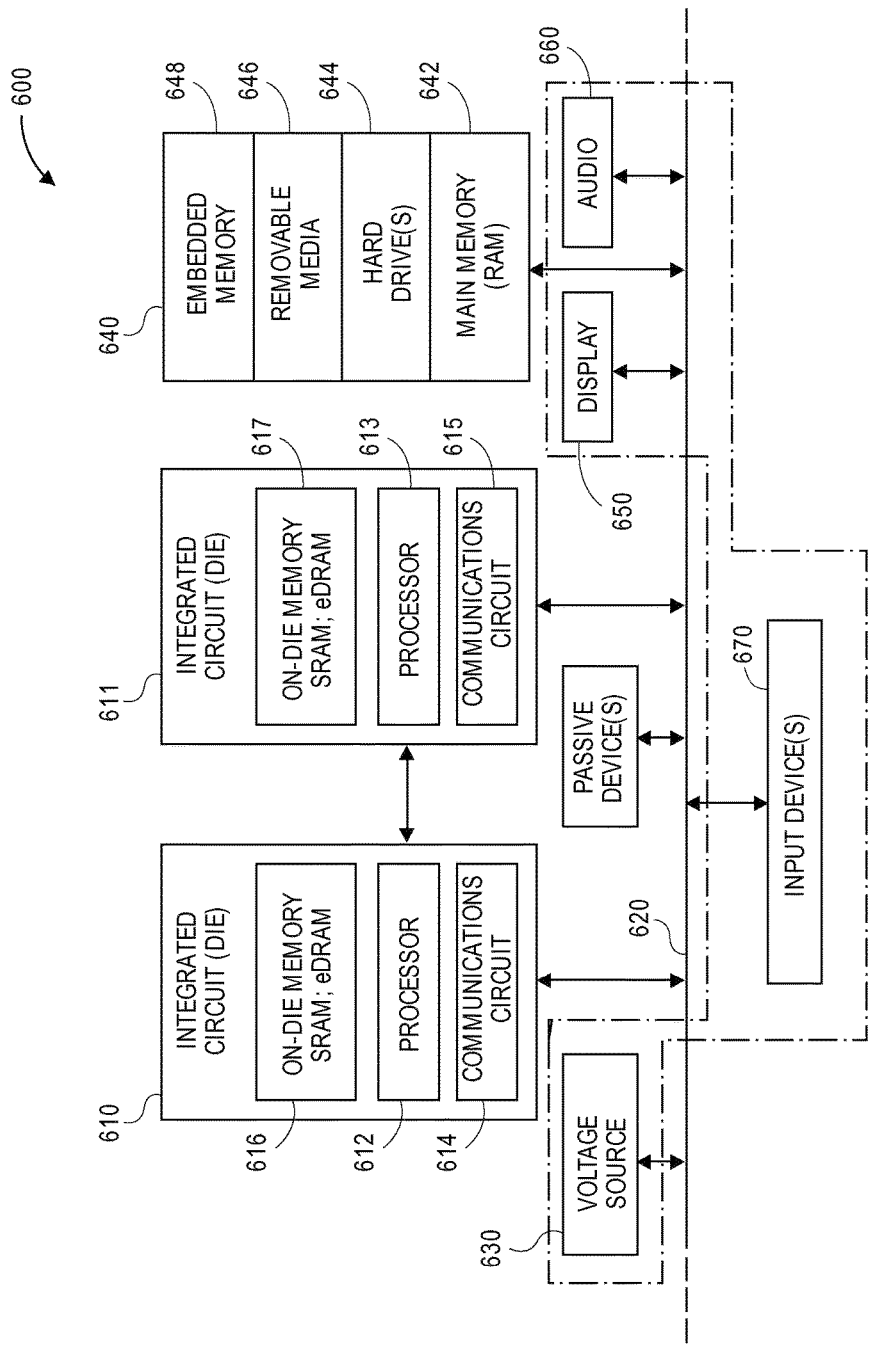
FIG. 6 is a schematic of a computer system, in accordance with an embodiment of the present invention.

FIG. 6 is a schematic of a computer system 600, in accordance with an embodiment of the present invention. The computer system 600 (also referred to as the electronic system 600) as depicted can embody a packaged semiconductor die and CTE-engineering die pair according to any of the several disclosed embodiments and their equivalents as set forth in this disclosure. The computer system 600 may be a mobile device such as a netbook computer. The computer system 600 may be a mobile device such as a wireless smart phone. The computer system 600 may be a desktop computer. The computer system 600 may be a hand-held reader.

In an embodiment, the electronic system 600 is a computer system that includes a system bus 620 to electrically couple the various components of the electronic system 600. The system bus 620 is a single bus or any combination of busses according to various embodiments. The electronic system 600 includes a voltage source 630 that provides power to the integrated circuit 610. In some embodiments, the voltage source 630 supplies current to the integrated circuit 610 through the system bus 620.

The integrated circuit 610 is electrically coupled to the system bus 620 and includes any circuit, or combination of circuits according to an embodiment. In an embodiment, the integrated circuit 610 includes a processor 612 that can be of any type. As used herein, the processor 612 may mean any type of circuit such as, but not limited to, a microprocessor, a microcontroller, a graphics processor, a digital signal processor, or another processor. In an embodiment, the processor 612 is a packaged semiconductor die and CTE-engineering die pair disclosed herein. In an embodiment, SRAM embodiments are found in memory caches of the processor. Other types of circuits that can be included in the integrated circuit 610 are a custom circuit or an application-specific integrated circuit (ASIC), such as a communications circuit 614 for use in wireless devices such as cellular telephones, smart phones, pagers, portable computers, two-way radios, and similar electronic systems. In an embodiment, the processor 610 includes on-die memory 616 such as static random-access memory (SRAM). In an embodiment, the processor 610 includes embedded on-die memory 616 such as embedded dynamic random-access memory (eDRAM).

In an embodiment, the integrated circuit 610 is complemented with a subsequent integrated circuit 611. Useful embodiments include a dual processor 613 and a dual communications circuit 615 and dual on-die memory 617 such as SRAM. In an embodiment, the dual integrated circuit 610 includes embedded on-die memory 617 such as eDRAM.

In an embodiment, the electronic system 600 also includes an external memory 640 that in turn may include one or more memory elements suitable to the particular application, such as a main memory 642 in the form of RAM, one or more hard drives 644, and/or one or more drives that handle removable media 646, such as diskettes, compact disks (CDs), digital variable disks (DVDs), flash memory drives, and other removable media known in the art. The external memory 640 may also be embedded memory 648 such as the first die in an embedded TSV die stack, according to an embodiment.

In an embodiment, the electronic system 600 also includes a display device 650, an audio output 660. In an embodiment, the electronic system 600 includes an input device such as a controller 670 that may be a keyboard, mouse, trackball, game controller, microphone, voice-recognition device, or any other input device that inputs information into the electronic system 600. In an embodiment, an input device 670 is a camera. In an embodiment, an input device 670 is a digital sound recorder. In an embodiment, an input device 670 is a camera and a digital sound recorder.

As shown herein, the integrated circuit 610 can be implemented in a number of different embodiments, including a packaged semiconductor die and CTE-engineering die pair according to any of the several disclosed embodiments and their equivalents, an electronic system, a computer system, one or more methods of fabricating an integrated circuit, and one or more methods of fabricating an electronic assembly that includes a packaged semiconductor die and CTE-engineering die pair according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed packaged semiconductor die and CTE-engineering die pair embodiments and their equivalents.

Thus, packaged semiconductor die and CTE-engineering die pairs and methods to form packaged semiconductor die and CTE-engineering die pairs have been disclosed. In an embodiment, a semiconductor package includes a substrate. A semiconductor die is embedded in the substrate and has a surface area. A CTE-engineering die is embedded in the substrate and coupled to the semiconductor die. The CTE-engineering die has a surface area the same and in alignment with the surface area of the semiconductor die. In one such embodiment, the semiconductor die is composed of silicon and the CTE-engineering die is composed of copper.

What is claimed is:

1. A semiconductor package, comprising:
   a molding layer;
   a semiconductor die in the molding layer, the semiconductor die having a surface area; and
   a CTE-engineering die in the molding layer, the CTE-engineering die bonded to the semiconductor die, the CTE-engineering die having a surface area the same and in alignment with the surface area of the semiconductor die, wherein the CTE-engineering die has flat sidewalls flush with flat sidewalls of the semiconductor die, wherein the CTE-engineering die comprises a metal, wherein the CTE-engineering die has a CTE different than a CTE of the semiconductor die.

2. The semiconductor package of claim 1, wherein the molding layer has a first surface, and the CTE-engineering die has a back surface, and wherein the back surface of the CTE-engineering die is co-planar with the first surface of the molding layer.

3. The semiconductor package of claim 2, wherein the molding layer has a second surface opposite the first surface, and wherein the semiconductor package further comprises solderballs on the second surface of the molding layer, the solderballs electrically coupled to the semiconductor die.

4. The semiconductor package of claim 1, further comprising solderballs on a surface of the molding layer, the solderballs electrically coupled to the semiconductor die.

5. The semiconductor package of claim 1, wherein the semiconductor die comprises silicon, and the CTE-engineering die comprises copper.

6. The semiconductor package of claim 1, wherein the CTE-engineering die is, or is greater than, approximately 5 times as thick as the semiconductor die.

7. The semiconductor package of claim 6, wherein the semiconductor die has a thickness of approximately 20 microns, and the CTE-engineering die has a thickness of approximately 100 microns.

8. The semiconductor package of claim 1, wherein the CTE-engineering die is bonded to the semiconductor die by a eutectic gold (Au) and tin (Sn) solder.

9. A semiconductor package, comprising:
   a substrate comprising a core material and one or more build-up-layers on the core material;
   a semiconductor die in the core material, the semiconductor die having a surface area; and
   a CTE-engineering die in the core material, the CTE-engineering die bonded to the semiconductor die, the CTE-engineering die having a surface area the same and in alignment with the surface area of the semiconductor die, wherein the CTE-engineering die has flat sidewalls flush with flat sidewalls of the semiconductor die, wherein the CTE-engineering die comprises a metal, wherein the CTE-engineering die has a CTE different than a CTE of the semiconductor die.

10. The semiconductor package of claim 9, further comprising solderballs on a surface of the one or more build-up layers, the solderballs electrically coupled to the semiconductor die.

11. The semiconductor package of claim 9, wherein the semiconductor die comprises silicon, and the CTE-engineering die comprises copper.

12. The semiconductor package of claim 9, wherein the CTE-engineering die is, or is greater than, approximately 5 times as thick as the semiconductor die.

13. The semiconductor package of claim 12, wherein the semiconductor die has a thickness of approximately 20 microns, and the CTE-engineering die has a thickness of approximately 100 microns.

14. The semiconductor package of claim 9, wherein the CTE-engineering die is bonded to the semiconductor die by a eutectic gold (Au) and tin (Sn) solder.

15. An apparatus, comprising:
a bumpless build-up layer (BBUL) package comprising a first build-up layer and a second build-up layer;
a semiconductor die in the first build-up layer of the BBUL package, the semiconductor die having a surface area; and
a CTE-engineering die in the first build-up layer of the BBUL package, the CTE-engineering die bonded to the first semiconductor die, the CTE-engineering die having a surface area the same and in alignment with the surface area of the first semiconductor die, wherein the CTE-engineering die has flat sidewalls flush with flat sidewalls of the first semiconductor die, wherein the CTE-engineering die comprises a metal, wherein the CTE-engineering die has a CTE different than a CTE of the first semiconductor die; and
a second semiconductor die housed in the second build-up layer of the BBUL package.

16. The apparatus of claim 15, further comprising solderballs on a surface of the BBUL package, the solderballs electrically coupled to the first semiconductor die.

17. The apparatus of claim 15, wherein the first semiconductor die comprises silicon, and the CTE-engineering die comprises copper.

18. The apparatus of claim 15, wherein the CTE-engineering die is, or is greater than, approximately 5 times as thick as the first semiconductor die.

19. The apparatus of claim 18, wherein the first semiconductor die has a thickness of approximately 20 microns, and the CTE-engineering die has a thickness of approximately 100 microns.

20. The apparatus of claim 15, wherein the CTE-engineering die is bonded to the first semiconductor die by a eutectic gold (Au) and tin (Sn) solder.

* * * * *